(12) United States Patent
Gaeta et al.

(10) Patent No.: US 7,078,968 B2
(45) Date of Patent: Jul. 18, 2006

(54) STEP GAIN-VARIABLE CMOS AMPLIFIER

(75) Inventors: Marco Gaeta, Sant'Angelo Lodigiano (IT); Giacomino Bollati, Castel San Giovanni (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 42 days.

(21) Appl. No.: 10/939,303

(22) Filed: Sep. 10, 2004

(65) Prior Publication Data
US 2005/0057306 A1 Mar. 17, 2005

(30) Foreign Application Priority Data
Sep. 11, 2003 (EP) ................................ 03425589

(51) Int. Cl.
*H03F 3/45* (2006.01)
(52) U.S. Cl. ..................................... 330/254
(58) Field of Classification Search ............... 330/254, 330/51, 295, 261; 455/311, 333, 293
See application file for complete search history.

(56) References Cited

U.S. PATENT DOCUMENTS 5,334,891 A * 8/1994 Marbot ...................... 327/281
6,198,329 B1 3/2001 Ezell et al. ................. 327/307
6,396,339 B1 5/2002 Jacobs ............................ 330/9
6,429,690 B1 8/2002 Castellucci et al. ......... 326/115
6,980,051 B1 * 12/2005 Ryynanen et al. .......... 330/254

FOREIGN PATENT DOCUMENTS

WO         03/023954        3/2003

* cited by examiner

*Primary Examiner*—Robert Pascal
*Assistant Examiner*—Hieu Nguyen
(74) *Attorney, Agent, or Firm*—Lisa K. Jorgenson; Allen, Dyer, Doppelt, Milbrath & Gilchrist, P.A.

(57) ABSTRACT

A step gain-variable CMOS amplifier includes an input pair of transistors, a bias current generator connected between a common source node of the input pair of transistors and a ground node, and a pair of load transistors. The pair of load transistors is connected between a supply voltage node and, respectively, to the drain nodes of the input pair of transistors. The CMOS amplifier includes a plurality of second input pairs of transistors to be connected in parallel to the input pair of transistors for increasing the effective width of the resultant transistors. Alternativelty, the CMOS amplifier includes a plurality of second load pairs of transistors to be connected in parallel to the load pair of transistors for increasing the effective width of the resultant transistors. Pairs of path selection switches may be programmably closed for connecting in parallel the selected pairs of transistors.

8 Claims, 2 Drawing Sheets

STEP GAIN-VARIABLE CMOS AMPLIFIER

FIELD OF THE INVENTION

The present invention relates in general to integrated CMOS analog circuits, and in particular, to a differential amplifier having a gain that is programmable in fixed steps.

BACKGROUND OF THE INVENTION

In signal processing systems it is useful to keep the output signal within a fixed voltage amplitude window when the amplitude of the input signal is varied. In other cases, it may be useful to keep the input signal within a fixed voltage amplitude window when the amplitude of the output signal is varied. Moreover, harmonic distortion should remain reduced throughout the range of selectable gain of the amplifier.

SUMMARY OF THE INVENTION

An object of the present invention is to provide a CMOS amplifier structure, the gain of which is given by a $gm_i/gm_0$ stage in which $gm_i$ may be changed by programming.

The step gain-variable CMOS amplifier in accordance with the invention is based on the basic structure of a differential amplifier including an input pair of transistors, a bias current generator connected between a common source node of the input pair of transistors and a ground node, and a pair of load transistors having a same type of conductivity as the input pair of transistors. The pair of load transistors is connected between a supply voltage node and, respectively, to the drain nodes of the input pair of transistors.

The CMOS amplifier may further comprise a plurality of second input pairs of transistors to be connected in parallel to the input pair of transistors for increasing the effective width of the resultant transistors. A plurality of path selection pairs of switches may be programmably closed for connecting in parallel the selected pairs of input transistors.

In an alternative embodiment, the CMOS amplifier may further comprise a plurality of second pairs of load transistors to be connected in parallel to the pair of load transistors for increasing the effective width of the resultant transistors. A plurality of path selection pairs of switches may be programmably closed for connecting in parallel the selected pairs of load transistors.

DETAILED DESCRIPTION OF THE PREFERRED EMBODIMENTS

Figure 1:
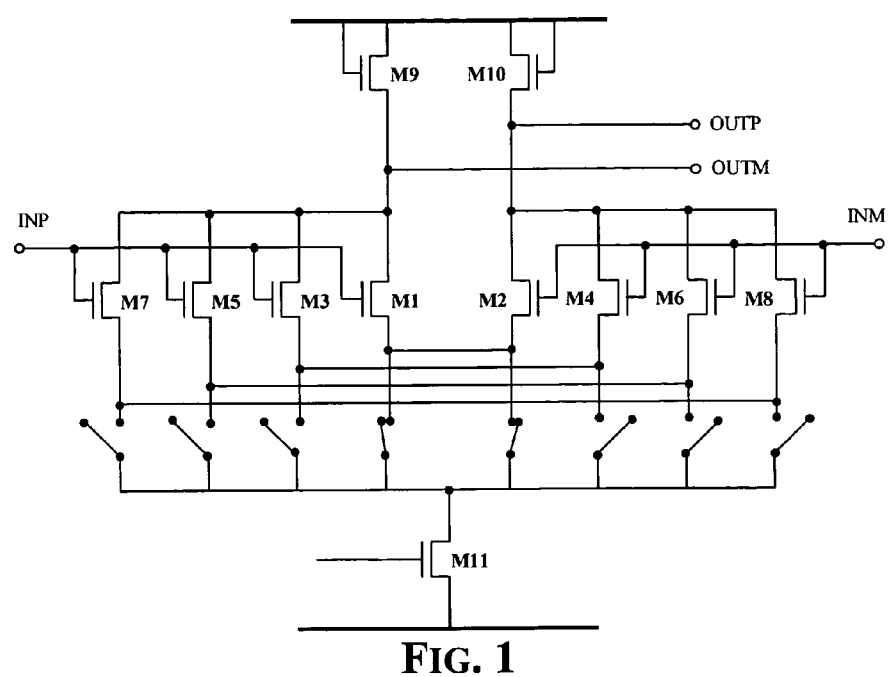
FIG. 1 is a schematic diagram of a step gain-variable CMOS amplifier according to a first embodiment of the invention.

To better illustrate the features and effectiveness of the invention, different embodiments will now be described in detail. FIG. 1 shows a $gm_i/gm_0$ amplifier structure according to a first embodiment. Notably, the gain is given by:

$$\text{Gain} = \frac{gm_1}{gm_9} \cong \frac{\sqrt{\left(\frac{W}{L}\right)_1 \cdot I_1}}{\sqrt{\left(\frac{W}{L}\right)_9 \cdot I_9}} \quad (1)$$

and the bandwidth is given by:

$$\text{Bandwidth} \cong \frac{gm_9}{C_{out}} \cong \frac{\sqrt{\left(\frac{W}{L}\right)_9 \cdot I_9}}{C_{out}} \quad (2)$$

where Cout is the output capacitance. Since $gm_9$ is fixed, the bandwidth remains practically constant for every programmed gain. A minor variation (~1%) that is tolerable may be due to different bias conditions of the resultant (effective) transistors of the input pairs.

An important formula for the overdrive voltage of the transistors (Vov=Vgs–Vth) is given in equation 3.

$$V_{ov} \cong \frac{I}{gm} \cong \sqrt{\frac{I}{(W/L)}} \quad (3)$$

with $gm_9$ and I being fixed. The gain of the amplifier is programmed by changing the width term W of the aspect ratio W/L of the resultant input transistors by switching on and off additional transistor pairs M3–M4, M5–M6, M7–M8, etc., in parallel to a core differential pair, for example M1–M2, that is always included in the circuit.

A dB-linear variable gain amplifier is commonly used to provide an output signal having a certain amplitude independent from the amplitude of the input signal. Therefore, the minimum gain configuration is used when the amplitude of the input signal is at its maximum (i.e., when the highest linearity of the amplifier is required). According to this embodiment, the overdrive of the transconductor is proportional to the input signal amplitude. The overdrive of the transconductor is composed of the M1–M2 core input pair to which other pairs up to the M7–M8 pair of FIG. 1 are selectively connected in parallel.

According to this first embodiment as illustrated in FIG. 1, for the minimum programmable gain the minimum transistor width is used for the input pair, which is referred to as W1. With the current being constant, i.e., independent from the programmed gain, the input differential pair has the maximum overdrive voltage Vov1, i.e., the highest linearity, when the resultant input transistor has the minimum width.

To increase the gain, more input transistor pairs are coupled to the functioning circuit, and the width of the effective transistors of the input pair W progressively becomes W1+W3+W5+W7, for example. By way of example and assuming that the minimum gain (obtained with an input pair sized W1 working with a voltage overdrive Vov1) is used for an input voltage swing Vinput1, if the input voltage swing decreases by a factor 2 (Vinput2=(1/2) *Vinput1), then the gain is incremented by the same factor 2. Therefore, the width of the input pair needs to be incremented by 4 times the minimum width W1, and consequently, the overdrive voltage of the resultant (effective) input pair (given by equation 3) reduces to Vov2=(1/2)*Vov1.

As noted above, the voltage overdrive of the input pair is inversely proportional to the programmed gain, while according to this embodiment, the voltage overdrive of the load pair of transistors remains fixed. This feature of the amplifier according to the first embodiment is particularly suited for applications where the purpose of the amplifier is to keep fixed the amplitude of the output voltage. In this embodiment, in fact, the linearity of each differential pair of transistors (i.e., the effective input transistor pair and the load transistor pair) is always proportional to the amplitude of the applied signal (i.e., the input signal for the effective input pair and the output signal for the output pair).

For applications working with a substantially fixed input voltage swing and output voltage swing proportional to the gain, the same concept of "fixed linearity" may be used, by keeping fixed the effective width of the transistors of the input pair and making the gain programmable by changing the effective width of the transistors of the load pair, which may be also be referred to as an output transistor pair.

Figure 2:
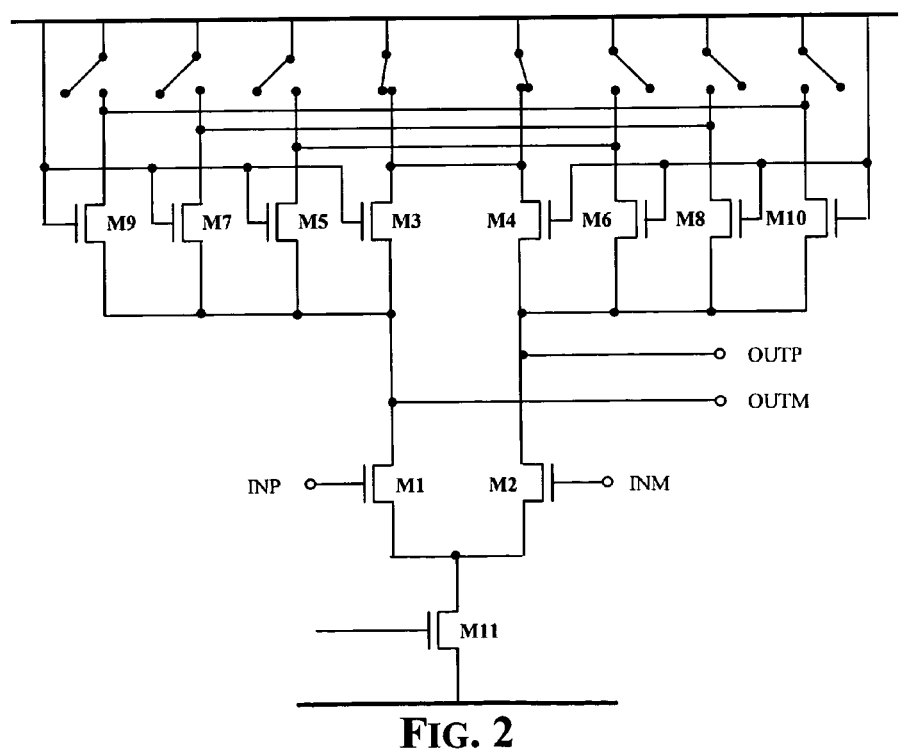
FIG. 2 is a schematic diagram of a step gain-variable CMOS amplifier according to an alternative embodiment of the invention.

This alternative embodiment of the amplifier according to the invention is shown in FIG. 2. Also in this alternative embodiment, all the previous considerations are valid except for bandwidth does not remain constant. In fact, the term $gm_9$ in equation 2 is no longer constant, corresponding in this case to the sum of the gm(s) of the load transistor pairs that are programmably connected into the functioning circuit of the amplifier.

In particular applications, the amplifier according to this alternative embodiment provides important advantages. Forming an amplifier in which the linearity of each "stage" is proportional to its voltage swing has the advantage of partially compensating distortion.

As an example, consider a unit gain stage. The resultant or effective load pair of transistors acts as a transresistor, and the transfer characteristics (i-v) are the inverse of the (v-i) transfer characteristics of the input pair of transistors as long as their overdrive is the same.

Intuitively, the distortion due to the compression effects of the v-i characteristics of the input MOS transistors is deleted by the opposite distortion due to the expansion effects of the i-v characteristics of the output pair of transistors. This is graphically illustrated in FIG. 3a.

Of course, when the gain is different from 1, input and load (output) transistors have different overdrives because they handle signals of different amplitudes. For example, suppose that the gain is −6 dB, then the output (load) MOS transistors operate with a signal that is one-half in amplitude as compared to the input MOS transistors, and correspondingly they need one-half the overdrive voltage to produce the same distortion for compensation purposes.

If $gm_1$ is the transconductance of the input transistors and $gm_2$ is the transconductance of the output transistors, then the overdrive ratio is given by the following equation 4:

$$\frac{Vov_1}{Vov_2} = \frac{1}{\text{Gain}} = \frac{gm_2}{gm_1} \quad (4)$$

Figure 3A:
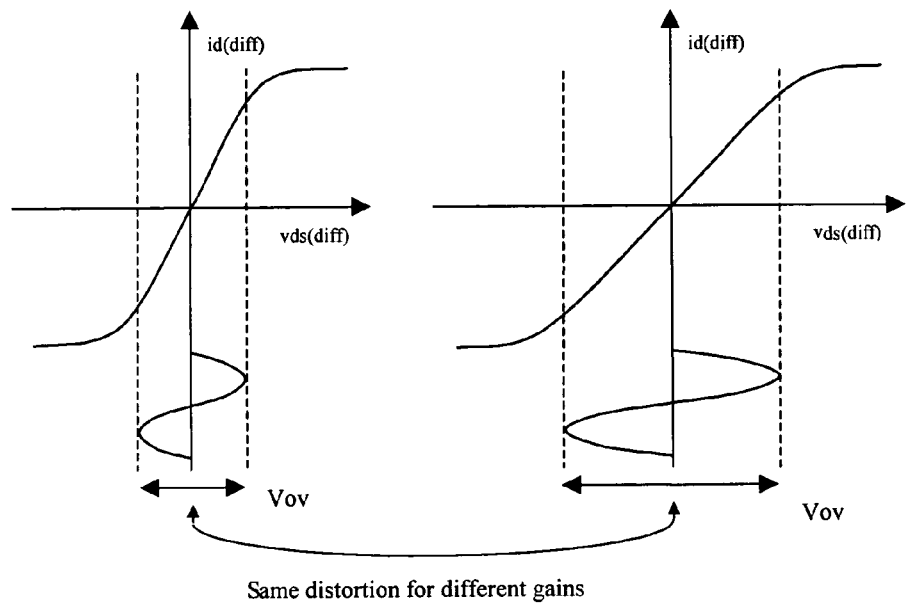
FIG. 3a is a plot showing transfer characteristics (v-i) of the effective transconductor pair for different gain settings of the amplifier of FIG. 1.

FIG. 3a shows how the linearity of the input pair is proportional to the input signal. In this way, the distortion may be optimized and maintained practically constant for every gain setting.

Figure 3B:
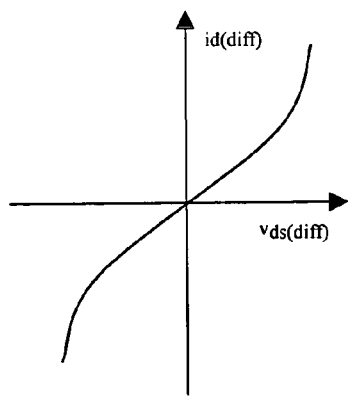
FIG. 3b is a plot showing transfer characteristics (i-v) of the transresistor M9–M10 of FIG. 1 or the effective transresistor M3–M10 of FIG. 2.

As already mentioned above, FIG. 3b shows that the load transistor pair (output transresistor) applies a distortion of an opposite sign as compared to the distortion introduced by the transistors of the input pair (input transconductor), and that may be made substantially equal for an effective compensation. Through a correct combination of the two characteristics (ideally leading to a substantially straight-line characteristic for null distortion), harmonic distortion may be easily optimized.

The circuit of the variable gain amplifier may be seen as a coarsely variable gain amplifier because of the step-by-step gain changes that may be implemented, as compared to a prior art continuous gain regulation amplifier. However, an advantage of the coarsely variable gain amplifier is given by the fact that the gain is changed by switching transistor pairs in or out of the operating circuit, thus making it possible to maintain optimal overdrive conditions (same THD) under every condition of operation.

This characteristic of the invention allows a significant reduction in the power as compared to other approaches because of the linearity of the building blocks of the amplifier. Namely, the input transconductor stage and the output transresistor linearities are lower than the resultant linearity of the whole amplifier. If a lower linearity of the two stages may be tolerated because of the implemented compensation, it is possible to save power. In contrast, if, for example, an amplifier with resistive loads (i.e., having high linearity) is considered, the linearity of the amplifier corresponds to the linearity of the input transconductor.

What is claimed is:

1. A step gain-variable CMOS amplifier comprising:
   a pair of input MOS transistors connected together at a common source node and having a first type of conductivity;
   a bias current generator connected between the common source node of said pair of input MOS transistors and a voltage reference;
   a pair of first load MOS transistors having the first type of conductivity, and each first load MOS transistor connected between a supply voltage node and a drain node of a respective input MOS transistor;
   a plurality of pairs of second load MOS transistors connectable in parallel to said pair of first load MOS transistors for incrementing an effective width of resultant transistors formed by said pairs of first and second load MOS transistors connected in parallel; and
   a plurality of pairs of path selection switches connected between the supply voltage node and said pairs of first and second load MOS transistors for connecting at least some of said pairs of first and second load MOS transistors in parallel by closing respective pairs of path selection switches.

2. A step gain-variable CMOS amplifier according to claim 1, wherein said pair of input MOS transistors has a fixed geometry for providing gain adaptivity consistent with an amplitude of an input signal.

3. A step gain-variable CMOS amplifier according to claim 1, wherein said pair of input MOS transistors and said pairs of first and second load MOS transistors each has an aspect ratio based upon a minimum width of definition of a fabrication process forming said MOS transistors.

4. A step gain-variable CMOS amplifier according to claim 1, wherein the voltage reference comprises ground.

5. A method for varying a gain of a CMOS amplifier comprising a pair of input MOS transistors connected together at a common source node, a pair of first load MOS transistors connected between a supply voltage node and drain nodes of the pair of input MOS transistors, a plurality of pairs of second load MOS transistors connectable in parallel to the pair of first load MOS transistors, and a plurality of pairs of path selection switches connected between the supply voltage node and the pairs of first and second load MOS transistors, the method comprising:

biasing the pair of input MOS transistors via a bias current generator connected between the common source node thereof and a voltage reference; and closing respective pairs of path selection switches for connecting at least some of the pairs of first and second load MOS transistors in parallel for incrementing an effective width of resultant transistors formed by the pairs of first and second load MOS transistors connected in parallel.

6. A method according to claim 5, wherein the pair of input MOS transistors has a fixed geometry for providing gain adaptivity consistent with an amplitude of an input signal.

7. A method according to claim 5, wherein the pair of input MOS transistors and the pairs of first and second load MOS transistors each has an aspect ratio based upon a minimum width of definition of a fabrication process forming the MOS transistors.

8. A method according to claim 5, wherein the voltage reference comprises ground.

\* \* \* \* \*